United States Patent
Tanaka et al.

(10) Patent No.: US 12,308,777 B2
(45) Date of Patent: May 20, 2025

(54) PROCESSING DEVICE, AND DETERMINATION METHOD FOR WINDING TEMPERATURE CALCULATION MODEL

(71) Applicant: OMRON Corporation, Kyoto (JP)

(72) Inventors: Masahito Tanaka, Kyoto (JP); Hitoshi Fukuhara, Kyoto (JP); Mamoru Egi, Kyoto (JP); Yasushi Ono, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 508 days.

(21) Appl. No.: 17/770,554

(22) PCT Filed: Oct. 20, 2020

(86) PCT No.: PCT/JP2020/039441
§ 371 (c)(1),
(2) Date: Apr. 20, 2022

(87) PCT Pub. No.: WO2021/106430
PCT Pub. Date: Jun. 3, 2021

(65) Prior Publication Data
US 2022/0393634 A1    Dec. 8, 2022

(30) Foreign Application Priority Data
Nov. 29, 2019 (JP) .................................. 2019-216312

(51) Int. Cl.
*G01K 13/08* (2006.01)
*G01K 13/00* (2021.01)
(Continued)

(52) U.S. Cl.
CPC .............. *H02P 29/64* (2016.02); *G01K 13/00* (2013.01); *G01R 27/02* (2013.01); *G01R 31/343* (2013.01); *G01K 13/08* (2013.01)

(58) Field of Classification Search
CPC ...... H02P 6/08; H02P 6/21; H02P 7/34; H02P 27/024; H02P 29/62; H02P 21/14;
(Continued)

(56) References Cited

U.S. PATENT DOCUMENTS 2,974,234 A * 3/1961 Rowe ................... H02K 17/00
                                                              290/46
3,896,357 A * 7/1975 Tanikoshi ................ H02P 6/06
                                                              318/400.04
(Continued)

FOREIGN PATENT DOCUMENTS

CN         102004008 A      4/2011
CN         109883575 A      6/2019
(Continued)

OTHER PUBLICATIONS

U.S. Appl. No. 17/770,554, filed Oct. 8, 2024_DE_10119201_A1_H.pdf, Oct. 24, 2002.*
(Continued)

*Primary Examiner* — Gail Kaplan Verbitsky
(74) *Attorney, Agent, or Firm* — ROSSI, KIMMS & McDOWELL LLP

(57) ABSTRACT

A processing apparatus acquires a first rise transition that is a rise transition of the temperature of a winding and a second rise transition that is a rise transition of the temperature detected by a temperature sensor in a state where voltage application for raising the temperature of the winding to a predetermined temperature is performed, determines a predetermined temperature characteristic model by calculating a predetermined parameter on the basis of the second rise transition, and further determines a winding temperature characteristic model by calculating a winding related parameter on the basis of the first rise transition.

7 Claims, 10 Drawing Sheets

(51) Int. Cl.
*G01R 27/02* (2006.01)
*G01R 31/34* (2020.01)
*H02P 29/64* (2016.01)

(58) Field of Classification Search
CPC ............. H02P 2101/15; H02P 2103/10; H02P 23/0031; H02P 23/14; H02P 29/64; H02P 6/34; H02P 9/007; G01K 13/00; G01R 27/02; G01R 31/343
See application file for complete search history.

(56) References Cited

U.S. PATENT DOCUMENTS

| | | | | |
|---|---|---|---|---|
| 4,023,083 | A * | 5/1977 | Plunkett | H02P 21/10 318/810 |
| 7,109,680 | B2 * | 9/2006 | Kubo | H02M 7/53871 318/641 |
| 2007/0070560 | A1 * | 3/2007 | Hikawa | H02P 29/64 361/29 |
| 2009/0066283 | A1 | 3/2009 | Son et al. | |
| 2011/0050141 | A1 | 3/2011 | Yeh et al. | |
| 2015/0048772 | A1 | 2/2015 | Nagata et al. | |

FOREIGN PATENT DOCUMENTS

| | | | | |
|---|---|---|---|---|
| CN | 110208642 | A * | 9/2019 | ............. G01R 31/06 |
| DE | 3706659 | A1 * | 9/1988 | |
| DE | 10119201 | A1 * | 10/2002 | ............. G06K 7/183 |
| DE | 102010038560 | A1 * | 4/2011 | ............. H02P 29/664 |
| DE | 102011075605 | B4 * | 11/2019 | ............. G01K 13/08 |
| EP | 3490138 | A1 | 5/2019 | |
| EP | 3863173 | A1 * | 8/2021 | |
| FR | 2692693 | A1 * | 12/1993 | ............. B60L 50/51 |
| GB | 2143688 | A * | 2/1985 | ............... B66B 1/28 |
| JP | H04283087 | A | 10/1992 | |
| JP | H0654572 | A | 2/1994 | |
| JP | H09261850 | A | 10/1997 | |
| JP | 2008141941 | A | 6/2008 | |
| JP | 2011015584 | A | 1/2011 | |
| JP | 2017051089 | A | 3/2017 | |
| SU | 1270361 | A1 * | 11/1986 | |
| WO | WO-2013145267 | A1 * | 10/2013 | ........... G05B 19/404 |

OTHER PUBLICATIONS

U.S. Appl. No. 17/770,554, filed Oct. 8, 2024_DE_3706659_A1_H.pdf, Sep. 15, 1988.*
U.S. Appl. No. 17/770,554, filed Oct. 8, 2024_FR_2692693_A1_H.pdf, Dec. 24, 1993.*
U.S. Appl. No. 17/770,554, filed Oct. 8, 2024_SU_1270361_A1_H.pdf, Nov. 15, 1986.*
U.S. Appl. No. 17/770,554, filed Oct. 8, 2024_WO_2013145267_A1_H.pdf,Oct. 3, 2013.*
U.S. Appl. No. 17/770,554, filed Oct. 8, 2024_EP_3863173_A1_H.pdf,Aug. 11, 2021.*
U.S. Appl. No. 17/770,554, filed Oct. 8, 2024_GB_2143688_A_H.pdf, Feb. 13, 1985.*
U.S. Appl. No. 17/770,554, filed Jan. 22, 2025_CN_110208642_A_H.pdf,Sep. 6, 2019.*
U.S. Appl. No. 17/770,554, filed Jan. 22, 2025_DE_102010038560_A1_H.pdf,Apr. 14, 2011.*
U.S. Appl. No. 17/770,554, filed Jan. 22, 2025_DE_102011075605_B4_H.pdf,Nov. 14, 2019.*
International Search Report issued in Intl. Appln. No. PCT/JP2020/039441 mailed Dec. 15, 2020. English translation provided.
Written Opinion issued in Intl. Appln. No. PCT/JP2020/039441 mailed Dec. 15, 2020. English translation provided.
Office Action issued in Chinese Application No. 202080073190.3, issued Jan. 3, 2025. English translation provided.
Han et al. "Temperature Field Analysis and Calculation of Brushless Doubly-Fed Machines Considering Global Region and Different Operating States." Electric Machines and Control, vol. 17, No. 5, May 2013, pp. 1-8. English language abstract provided.
Sciascera et al. "Analytical Thermal Model for Fast Stator Winding Temperature Prediction." IEEE Transactions on Industrial Electronics, vol. 64, No. 8, Aug. 2017, pp. 6116-6126.

* cited by examiner

PROCESSING DEVICE, AND DETERMINATION METHOD FOR WINDING TEMPERATURE CALCULATION MODEL

TECHNICAL FIELD

The present invention relates to a technique for adjusting a model parameter related to electronic thermal of a motor.

BACKGROUND ART

Motors are used in various fields, and rotational speeds, motor loads, and the like, which are use conditions thereof, are also various. In addition, the ambient atmosphere of a motor is not necessarily constant. In general, when the ambient temperature of a motor increases, it is difficult to dissipate heat from the motor, and the use environment thereof becomes severe. In the case of driving a motor, when the motor is placed in an overload environment, the winding temperature of the motor excessively rises, and the winding may be burned out. In order to avoid such burnout of a winding, there is a technique in which a temperature sensor such as a thermistor and a thermostat is embedded in a motor and the temperature of the winding is directly detected by them to avoid overload operation of the motor (See, for example, Patent Document 1). However, in such a case, it is necessary to embed the temperature sensor in the motor, and it is difficult to appropriately detect the temperature of the winding unless the temperature sensor is accurately disposed at a predetermined location.

In contrast, there has been developed a technique related to electronic thermal of calculating a load situation from a current command passed to a motor without using a direct sensor such as a temperature sensor and determining overheating of a winding. In such electronic thermal, overheating of the winding is determined on software. For example, in the technique disclosed in Patent Document 2, a winding resistance value is estimated on the basis of parameters such as a voltage applied to a motor, a current, and an induced voltage of the motor, and a winding temperature is estimated from the winding resistance value that has been estimated. In the technique disclosed in Patent Document 3, the winding temperature at the start is estimated from the winding resistance value measured at the start of the motor, and then the transition of the winding temperature is estimated on the basis of the current flowing through the motor.

PRIOR ART DOCUMENTS

Patent Documents

Patent Document 1: Japanese Unexamined Patent Publication No. 04-283087
Patent Document 2: Japanese Unexamined Patent Publication No. 2011-15584
Patent Document 3: Japanese Unexamined Patent Publication No. 09-261850

SUMMARY OF THE INVENTION

Problems to be Solved by the Invention

In order to avoid overheating of a winding by using the electronic thermal technique, it is preferable that the specifications related to the motor are clear. That is, if physical parameters such as the resistance value of the winding and the induced voltage of the motor related to the temperature of the winding are clear, the temperature of the winding can be estimated more accurately. However, in a case where a motor is driven by a driver, physical parameters of the motor are not necessarily clear. Therefore, suppression of overheating of a winding by the electronic thermal technique has to be performed after securing a margin for safety, and tends to be excessive protection.

In contrast, it is also possible to suppress overheating of the winding of a motor by disposing a temperature sensor on the winding and detecting the temperature. However, as described above, since the detection result greatly depends on the arrangement of the temperature sensor in the motor, it is not easy to realize winding protection with high accuracy. Even if a preferable arrangement can be made, there is a predetermined heat capacity between the winding and the temperature sensor, and furthermore, there is a response delay in the temperature sensor itself, so that detection of the temperature sensor itself includes a delay. Therefore, in the case of using a temperature sensor, it is not easy to detect a rapid temperature change due to a large current in a timely manner.

The disclosure of the present application has been made in view of such a problem, and an object of the present disclosure is to provide a technique for accurately estimating the temperature of a winding regarding electronic thermal of a motor.

Means for Solving the Problem

In the disclosure of the present application, in order to solve the above problem, a configuration is adopted in which a winding temperature characteristic model and a predetermined temperature characteristic model for electronic thermal of a motor are determined by using a rise transition of a winding temperature obtained when a predetermined voltage is applied and a rise transition of a temperature detected by a temperature sensor arranged to detect the winding temperature. By reflecting the detection value of the temperature sensor in the electronic thermal technique in this manner, the temperature of the motor winding can be more accurately estimated by electronic thermal.

Specifically, the present disclosure provides a processing apparatus that determines a calculation model for estimating a temperature of a winding, the calculation model being included in electronic thermal of a motor including a stator around which the winding is wound and a rotor, the calculation model including a winding temperature characteristic model including a winding related parameter related to a temperature characteristic of the winding, and a predetermined temperature characteristic model including a predetermined parameter related to a characteristic of a temperature in the vicinity of the winding detected by a temperature sensor disposed in the vicinity of the winding, the processing apparatus including: a temperature transition acquisition unit configured to acquire a first rise transition that is a rise transition of a temperature of the winding and a second rise transition that is a rise transition of a temperature detected by the temperature sensor in a state where voltage application for raising the temperature of the winding to a predetermined temperature is performed; and a determination unit configured to determine the predetermined temperature characteristic model by calculating the predetermined parameter on the basis of the second rise transition, and further configured to determine the winding temperature characteristic model by calculating the winding related parameter on the basis of the first rise transition.

The processing apparatus of the present disclosure is configured to suppress an excessive temperature rise of a winding by an electronic thermal technique with respect to a motor in which a temperature sensor is disposed in the vicinity of the winding in order to detect the winding temperature of the motor. As the temperature sensor, a known temperature sensor can be adopted. The temperature sensor inside the motor is preferably arranged at a location where a temperature detection unit of the temperature sensor comes into contact with the winding. However, the arrangement of the temperature sensor is not limited to a specific arrangement as long as the temperature sensor is located in the vicinity of the winding and can detect the temperature in the vicinity of the winding.

Then, the processing apparatus determines the winding temperature characteristic model and the predetermined temperature characteristic model so as to enable estimation of the winding temperature at the time of voltage application by using the calculation model including the winding temperature characteristic model and the predetermined temperature characteristic model.

The winding temperature characteristic model is a model for calculating the temperature characteristic of the winding obtained when the thermal influence of the stator is virtually removed in the motor. Examples of the winding related parameter included in the winding temperature characteristic model include a thermal resistance, a thermal time constant, and the like related to the winding.

In addition, the predetermined temperature characteristic model is a model for calculating the characteristic of the temperature detected by the temperature sensor obtained when the thermal influence of the stator is virtually removed in the motor. It is considered that the winding temperature is reflected in detection by the temperature sensor. Examples of the predetermined parameter included in the predetermined temperature characteristic model include a thermal resistance, a thermal time constant, and the like related to temperature detection by the temperature sensor.

Here, the temperature transition acquisition unit acquires two temperature transitions (rise transitions) related to the winding in a state where a voltage is applied in order to raise the temperature of the winding to a predetermined temperature. One rise transition is a first rise transition which is a temperature transition actually occurring in the winding, and the other rise transition is a second rise transition which is a rise transition of the temperature detected by the temperature sensor. In order to estimate the winding temperature by using the calculation model including the predetermined temperature characteristic model and the winding temperature characteristic model with the electronic thermal technique, it is necessary to appropriately consider the influence of the temperature transition of the stator on the winding temperature.

Here, the first rise transition is a transition of the winding temperature and the second rise transition is a transition of the temperature detected by the temperature sensor disposed in the vicinity of the winding. Therefore, it is considered that both the first rise transition and the second rise transition are affected by the temperature transition of the stator of the motor that can be regarded as substantially the same. This means that by using the first rise transition and the second rise transition, it is possible to estimate the winding temperature in consideration of the influence of the temperature transition of the stator with the electronic thermal technique. Therefore, in the processing apparatus, the determination unit determines the predetermined temperature characteristic model by calculating the predetermined parameter on the basis of the second rise transition, and further determines the winding temperature characteristic model by calculating the winding related parameter on the basis of the first rise transition. The calculation model including the predetermined temperature characteristic model and the winding temperature characteristic model determined in this manner enables estimation of the winding temperature in which the influence of the temperature transition of the stator is suitably reflected in such a manner as to absorb the delay in temperature detection included in the temperature sensor.

In the processing apparatus, the determination unit may determine the predetermined temperature characteristic model by calculating the predetermined parameter on the basis of the second rise transition via a stator temperature characteristic model including a stator related parameter related to a temperature characteristic of the stator and having a correlation with the winding temperature characteristic model and the predetermined temperature characteristic model, and may further determine the winding temperature characteristic model by calculating the winding related parameter on the basis of the first rise transition via the stator temperature characteristic model. The stator temperature characteristic model is a model for calculating the temperature characteristic of the stator obtained when the thermal influence of the winding is virtually removed in the motor. Examples of the stator related parameter included in the stator temperature characteristic model include a thermal resistance, a thermal time constant, and the like related to the stator. By adopting such a configuration, it is possible to determine the predetermined temperature characteristic model and the winding temperature characteristic model that suitably reflect the influence of the temperature transition of the stator.

In the processing apparatus, the temperature transition acquisition unit may acquire the first rise transition on the basis of the resistance value of the winding. As a result, when the predetermined temperature characteristic model and the winding temperature characteristic model are determined, the rise transition of the winding temperature can be accurately measured by a measurement form different from the temperature sensor.

The processing apparatus may further include a frequency response acquisition unit configured to acquire a frequency response in the motor when a voltage applied to the winding is an input and a current flowing through the winding is output, and a resistance calculation unit configured to calculate a resistance value of the winding on the basis of the frequency response. By focusing on the electrical characteristic of the winding and using the frequency response as described above, the voltage applied to the winding in order to detect the resistance value of the winding can be reduced as much as possible, fluctuation of the winding temperature caused by the voltage application can be suppressed, and the resistance value of the winding can be measured more accurately.

In addition, in the processing apparatus, voltage application in a first cycle may be performed in the voltage application, the resistance calculation unit may calculate the resistance value of the winding at the time of the voltage application on the basis of the frequency response acquired by the frequency response acquisition unit according to the current output from the motor at the time of inputting the voltage application in the first cycle, and the temperature transition acquisition unit may acquire the first rise transition on the basis of the resistance value of the winding calculated by the resistance calculation unit. According to such a configuration, regarding the measurement of the first rise transition, the fluctuation of the winding temperature can be suppressed, and the resistance value of the winding can be more accurately measured.

Then, in the processing apparatus described above, the rotor of the motor may be rotationally driven at a predetermined constant speed when the voltage application is performed. In the temperature detection by the temperature sensor, there is a strong tendency that the temperature of the winding close to the detection unit of the temperature sensor is detected. In contrast, when a voltage is applied to the winding in order to acquire the second rise transition, if the applied current flows unevenly to any phase (for example, in a case where the motor is a three-phase AC motor, any one of U, V, and W phases) constituting the winding of the motor, temperature detection by the temperature sensor may vary. Therefore, by rotating the rotor at a predetermined constant speed as described above, the applied current can flow substantially uniformly through the windings of the motor, and the second rise transition can be suitably acquired.

In order to solve the above problem, the present disclosure can also be grasped from the aspect of a determination method of a winding temperature calculation model. That is, the present disclosure provides a method of determining a calculation model included in an electronic thermal of a motor including a stator around which a winding is wound and a rotor, the calculation model estimating a temperature of the winding, the calculation model including a winding temperature characteristic model including a winding related parameter related to a temperature characteristic of the winding, and a predetermined temperature characteristic model including a predetermined parameter related to a characteristic of a temperature in the vicinity of the winding detected by a temperature sensor disposed in the vicinity of the winding. The method includes: a step of acquiring a first rise transition that is a rise transition of the temperature of the winding and a second rise transition that is a rise transition of the temperature detected by the temperature sensor in a state where voltage application for raising the temperature of the winding to a predetermined temperature is performed; and a step of determining the predetermined temperature characteristic model by calculating the predetermined parameter on the basis of the second rise transition, and further determining the winding temperature characteristic model by calculating the winding related parameter on the basis of the first rise transition. In the step of determining, the predetermined temperature characteristic model may be determined by calculating the predetermined parameter on the basis of the second rise transition via a stator temperature characteristic model including a stator related parameter related to a temperature characteristic of the stator and having a correlation with the winding temperature characteristic model and the predetermined temperature characteristic model, and furthermore, the winding temperature characteristic model may be determined by calculating the winding related parameter on the basis of the first rise transition via the stator temperature characteristic model. In addition, the technical idea disclosed for the processing apparatus described above can be applied to the determination method of the winding temperature calculation model as long as no technical discrepancy occurs.

Effect of the Invention

Regarding the electronic thermal of the motor, temperature estimation of the winding can be accurately performed.

MODE FOR CARRYING OUT THE INVENTION

Application Example

An example of a processing apparatus that adjusts a model parameter for estimating the temperature of a motor winding in electronic thermal in the motor 2 (see FIG. 4) having the electronic thermal will be described with reference to FIGS. 1 to 3. Note that in the embodiment of the present disclosure, the motor 2 only needs to have a configuration in which a winding is wound around a stator and a rotor is provided, and a specific configuration thereof is not limited to a particular configuration. In addition, a temperature sensor 3 is disposed inside the motor 2 so as to be able to detect the winding temperature thereof, and more specifically, the temperature sensor 3 is disposed so that a detection unit of the temperature sensor 3 is located in the vicinity of the winding, preferably the detection unit is in contact with the winding.

Figure 1:
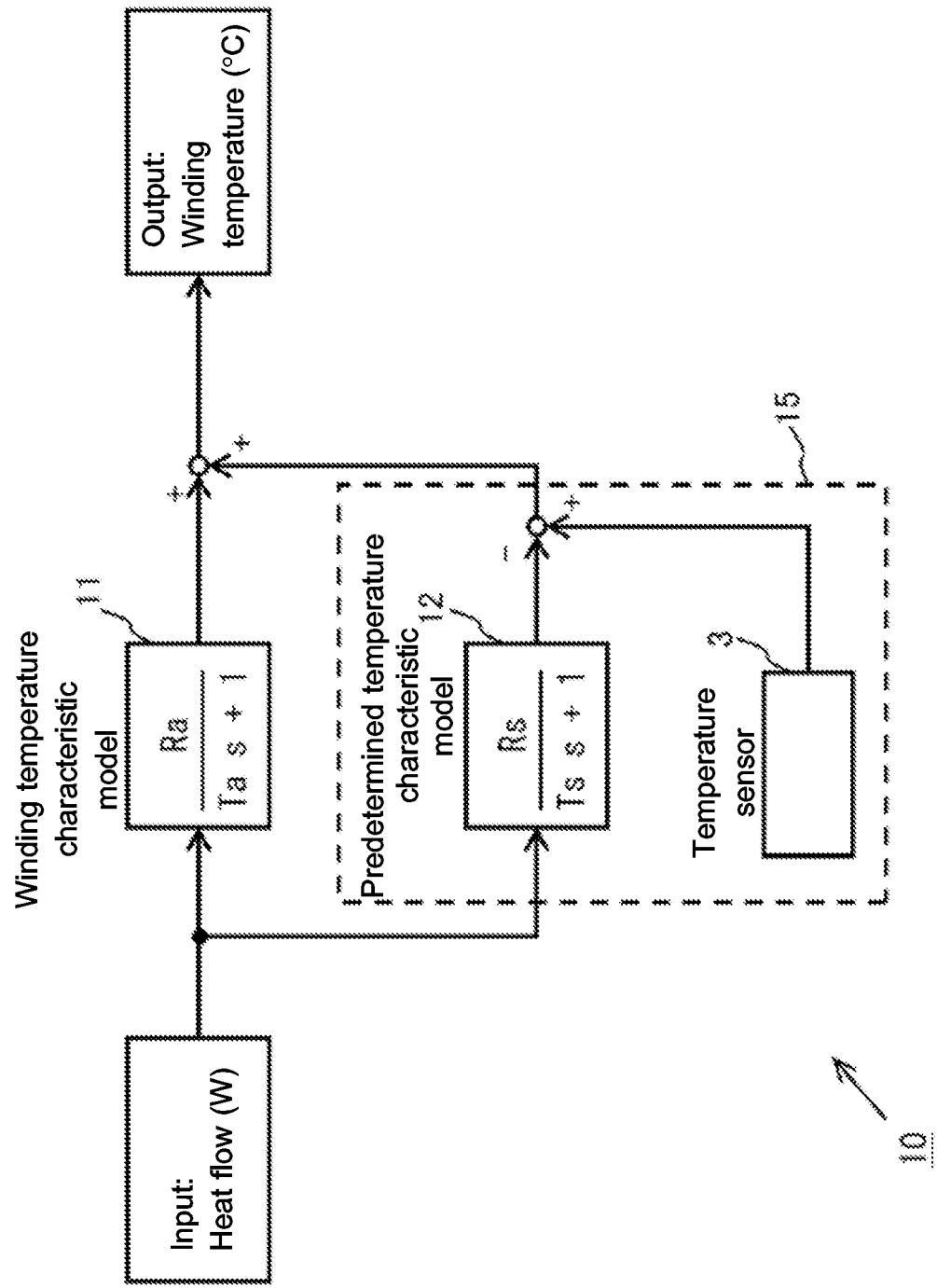
FIG. 1 is a diagram illustrating a configuration of a calculation model including a winding temperature characteristic model and a predetermined temperature characteristic model.
Figure 2A:
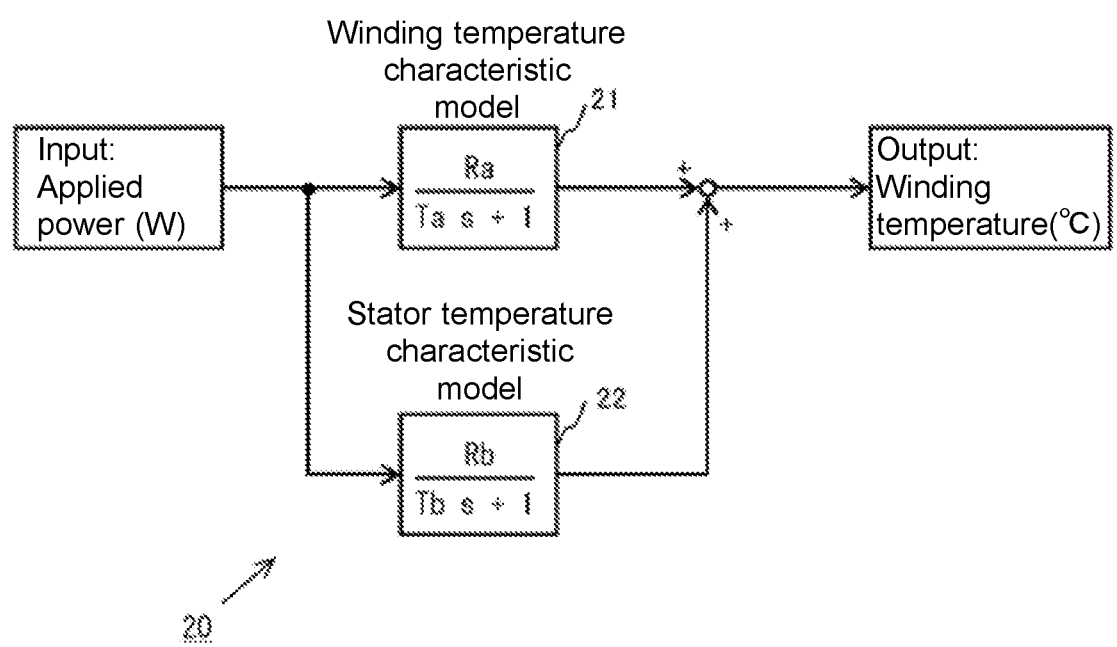
FIG. 2A is a diagram for explaining a correlation between the winding temperature characteristic model and a stator temperature characteristic model.
Figure 2B:
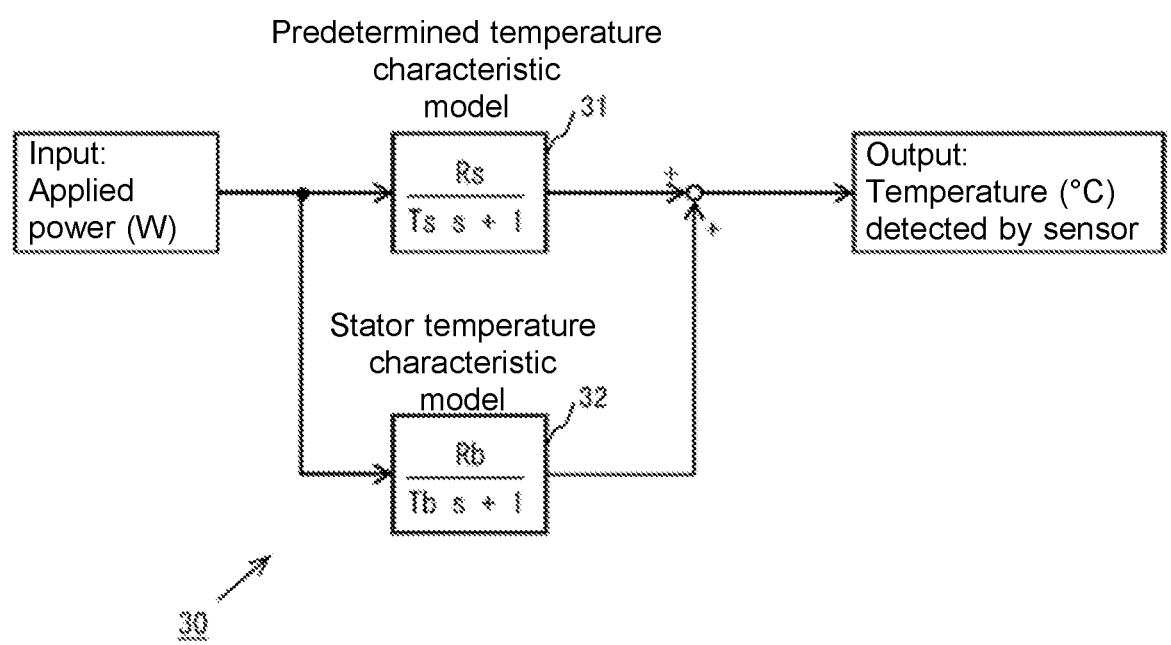
FIG. 2B is a diagram for explaining a correlation between the predetermined temperature characteristic model and a stator temperature characteristic model.

Here, FIG. 1 illustrates a schematic structure of a calculation model 10 for calculating the winding temperature included in electronic thermal of the motor. In addition, FIGS. 2A and 2B are diagrams for describing derivation of the calculation model 10, and illustrate a correlation between a winding temperature characteristic model and a stator temperature characteristic model, and a correlation between a predetermined temperature characteristic model and a stator temperature characteristic model, respectively. FIG. 3 is a diagram illustrating transition of the voltage applied to the motor when calculation parameters used in the calculation model 10 illustrated in FIG. 1, that is, a winding related parameter and a predetermined parameter are determined and transition of the winding temperature at that time.

Here, before explaining the calculation model 10, a calculation model (hereinafter referred to as a "base calculation model") 20 that can estimate the temperature of a winding in consideration of main heat sources that can affect the winding temperature in the motor 2, that is, the winding and a stator that are structures having a relatively large heat capacity will be described with reference to FIG. 2A. The base calculation model 20 is a program for calculating the winding temperature of the motor 2, and outputs the winding temperature of the motor when the applied power in the motor is given as an input thereof. Note that the applied power can be regarded as a so-called copper loss caused by the electric resistance of the winding coil of the motor, and is physically proportional to the square of the current flowing through a winding coil. As illustrated in FIG. 1, the base calculation model 20 includes a winding temperature characteristic model 21 and a stator temperature characteristic model 22 as sub models constituting the base calculation model 20. The winding temperature characteristic model 21 is a model for calculating the temperature characteristic of the winding obtained when the thermal influence of the stator is virtually removed in the motor. The stator temperature characteristic model 22 is a model for calculating the temperature characteristic of the stator obtained when the thermal influence of the winding is virtually removed in the motor. As described above, the base calculation model 20 includes both the winding temperature characteristic model 21 and the stator temperature characteristic model 22 and the sum of the outputs of the models is calculated as the winding temperature of the motor as illustrated in FIG. 2A.

Therefore, the winding temperature of the motor is calculated in consideration of the correlation between the stator and the winding.

Here, the winding temperature characteristic model 21 will be described. The winding temperature characteristic model 21 is expressed by the following Formula 1 including a thermal resistance Ra and a thermal time constant Ta related to the winding, which are parameters (winding related parameters) related to the temperature characteristic of the winding. Note that the thermal resistance Ra is a value representing the degree of difficulty of heat transfer, and is a parameter representing an amount of temperature rise per heat amount generated in unit time. In the embodiment, thermal resistance obtained when the winding of the motor is regarded as a thermally homogeneous object is adopted. The thermal time constant Ta is a parameter representing the degree of responsiveness of the winding to temperature change, and is defined as the time required to change by 63.2% of the temperature difference when the winding transitions from an initial thermal equilibrium state to another thermal equilibrium state.

$$\text{Winding temperature characteristic model} = Ra/(Ta \cdot s + 1) \quad (1)$$

Next, the stator temperature characteristic model 22 will be described. The stator temperature characteristic model 22 is expressed by the following Formula 2 including a thermal resistance Rb and a thermal time constant Tb related to the stator, which are parameters (stator related parameters) related to the temperature characteristic of the stator. Note that the definition of the thermal resistance Rb is the same as the definition of the thermal resistance Ra described above, and in the embodiment, the thermal resistance obtained when the stator of the motor is regarded as a thermally homogeneous object is adopted. The thermal time constant Tb is a parameter representing the degree of responsiveness of the stator to temperature change, and is the same as the definition of the thermal time constant Ta described above.

$$\text{Stator temperature characteristic model} = Rb/(Tb \cdot s + 1) \quad (2)$$

Then, in the base calculation model 20, an input (applied power in the motor) is passed to the winding temperature characteristic model 21 and the stator temperature characteristic model 22. Then, the outputs of the respective models are added to obtain an output of the base calculation model 20, that is, an estimated temperature of the motor winding. Note that when the outputs of the respective models are added, values obtained by multiplying the outputs of the models by predetermined gains may be added. By configuring the base calculation model 20 in this manner, the winding temperature of the motor is estimated in consideration of the correlation between the stator and the winding.

In a case where the base calculation model 20 is used to estimate the winding temperature in this manner, it is necessary to specify the stator temperature characteristic model 22. However, in order to specify the stator temperature characteristic model 22, it is preferable to form a situation in which the winding does not have a thermal influence on the stator as much as possible, but it is not easy. Therefore, in the disclosure of the present application, the transition of the temperature detected by the temperature sensor 3 arranged in the vicinity of the winding of the motor 2 is used. FIG. 2B illustrates a calculation model (hereinafter, referred to as a "winding vicinity calculation model") 30 capable of estimating the temperature in the vicinity of the winding, that is, the temperature detected by the temperature sensor 3. The winding vicinity calculation model 30 is a program for calculating the temperature detected by the temperature sensor 3, and outputs the temperature detected by the temperature sensor 3 when the applied power in the motor 2 is given as an input. As illustrated in FIG. 2B, the winding vicinity calculation model 30 includes a predetermined temperature characteristic model 31 and a stator temperature characteristic model 32 as sub models constituting the winding vicinity calculation model 30.

The predetermined temperature characteristic model 31 is a model for calculating the detected temperature characteristic of the temperature sensor 3 (temperature characteristic in the vicinity of the winding) when the thermal influence of the stator is virtually removed in the motor. It can be considered that the temperature characteristic of the winding is reflected in the detected temperature characteristic. The stator temperature characteristic model 32 is a model for calculating the temperature characteristic of the stator when the thermal influence of the winding is virtually removed in the motor. Therefore, the stator temperature characteristic model 32 can be considered to be the same as the stator temperature characteristic model 22 illustrated in FIG. 2A. As described above, the winding vicinity calculation model 30 includes both the predetermined temperature characteristic model 31 and the stator temperature characteristic model 32, and the sum of the outputs of the respective models is calculated as the temperature detected by the temperature sensor 3 as illustrated in FIG. 2B.

The predetermined temperature characteristic model 31 is expressed by the following Formula 3 including the temperature detected by the temperature sensor 3, that is, a thermal resistance Rs and a thermal time constant Ts, which are parameters (predetermined parameters) related to the temperature characteristic in the vicinity of the winding. Note that the definition of the thermal resistance Rs is the same as the definition of the thermal resistance Ra described above, and in the embodiment, the thermal resistance obtained when the winding of the motor and the space in the vicinity thereof are regarded as a thermally homogeneous object is adopted. The thermal time constant Ts is a parameter representing the degree of responsiveness of the winding and the space in the vicinity thereof to temperature change, and is the same as the definition of the thermal time constant Ta described above.

$$\text{Predetermined temperature characteristic model} = Rs/(Ts \cdot s + 1) \quad (3)$$

Since the stator temperature characteristic model 32 can be regarded as the same as the stator temperature characteristic model 22 as described above, a detailed description thereof will be omitted. Then, in the winding vicinity calculation model 30, an input (applied power in the motor) is passed to the predetermined temperature characteristic model 31 and the stator temperature characteristic model 32. Then, the outputs of the predetermined temperature characteristic model 31 and the stator temperature characteristic model 32 are added to obtain an output of the winding vicinity calculation model 30, that is, an estimated value of the temperature detected by the temperature sensor 3.

Here, comparing FIGS. 2A and 2B, both the base calculation model 20 for estimating the winding temperature and the winding vicinity calculation model 30 for estimating the temperature detected by the temperature sensor 3 include the stator temperature characteristic models 22 and 32. Therefore, the calculation model 10 illustrated in FIG. 1 can be derived by substituting the stator temperature characteristic model 32 derived from the winding vicinity calculation model 30 into the stator temperature characteristic model 22 included in the base calculation model 20.

On the basis of the above, the calculation model 10 included in the electronic thermal will be described with reference to FIG. 1. The calculation model 10 is a program for calculating the winding temperature of the motor in the electronic thermal of the motor, and outputs the winding temperature of the motor when the applied power in the motor is given as an input. As illustrated in FIG. 1, the calculation model 10 includes a winding temperature characteristic model 11 and a predetermined temperature characteristic model 12 as sub models constituting the calculation model 10, and the temperature sensor 3. The winding temperature characteristic model 11 is a model for calculating the temperature characteristic of the winding when the thermal influence of the stator is virtually removed in the motor, and is identical to the winding temperature characteristic model 21 illustrated in FIG. 2A. The predetermined temperature characteristic model 12 is a model for calculating the detected temperature characteristic of the temperature sensor 3 (temperature characteristic in the vicinity of the winding) when the thermal influence of the stator is virtually removed in the motor, and is identical to the predetermined temperature characteristic model 31 illustrated in FIG. 2B.

In the calculation model 10 configured as described above, a portion surrounded by a broken line 15 in FIG. 1 is a configuration corresponding to the stator temperature characteristic model 32 illustrated in FIG. 2B. Therefore, when the input (applied power in the motor) is passed to the winding temperature characteristic model 11 and the predetermined temperature characteristic model 12, the difference between the output of the temperature sensor 3 and the predetermined temperature characteristic model 12 is added to the output of the winding temperature characteristic model 11, and the obtained value is the output of the calculation model 10, that is, the estimated temperature of the motor winding. Note that when the outputs of the respective models are added, values obtained by multiplying the outputs of the models by predetermined gains may be added.

Next, calculation of the thermal resistance Ra and the thermal time constant Ta used in the winding temperature characteristic models 11 and 21, calculation of the thermal resistance Rs and the thermal time constant Ts used in the predetermined temperature characteristic models 12 and 31, and calculation of the thermal resistance Rb and the thermal time constant Tb used in the stator temperature characteristic models 22 and 32 will be described with reference to FIG. 3. Note that these parameters Ra, Rb, Rs, Ta, Tb, and Ts are also collectively referred to as model parameters.

Figure 3:
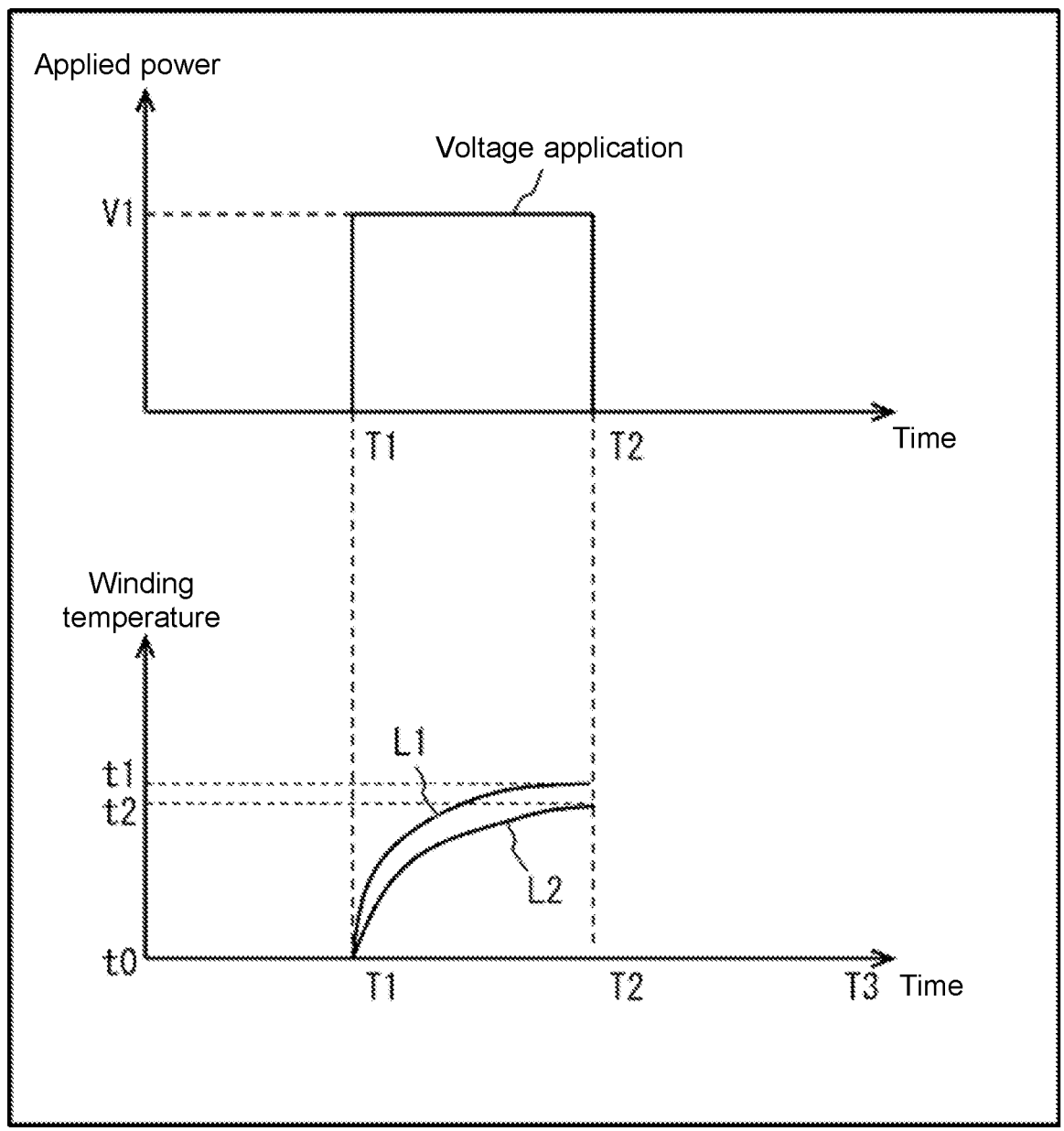
FIG. 3 is a diagram illustrating transition of a voltage applied to a motor when the calculation model is adapted to a motor, and transitions of a winding temperature and a temperature detected by a temperature sensor at that time.

In the transition of the applied voltage illustrated in the upper part of FIG. 3, voltage is applied to the motor 2 in order to raise the winding temperature to a predetermined temperature in the period from time point T1 to time point T2. During the period from the time point T1 to the time point T2, since the winding temperature of the motor rises and converges as indicated by line L1 in the lower part of FIG. 3 (rise from temperature t0 to temperature t1), transition of the winding temperature in the period is referred to as a first rise transition L1. In addition, transition of the temperature actually detected by the temperature sensor 3 arranged to detect the temperature in the vicinity of the motor winding is indicated by line L2 (rises from temperature t0 to temperature t2 and converges). Since some heat capacity is interposed between the winding and the temperature sensor 3, the temperature of the second rise transition L2 is slightly lower than that of the first rise transition L1. In addition, a voltage V1 is applied such that a current flows only in a d-axis so that the rotor of the motor 2 does not rotate when a voltage is applied. In this way, it is possible to avoid inadvertent driving of the drive shaft of the motor 2 when the voltage is applied. Alternatively, the voltage V1 may be applied such that the rotor of the motor 2 rotates at a predetermined low speed (for example, several tens rpm) when the voltage is applied. In this way, the current can uniformly flow in the winding of the motor 2, and the influence of the arrangement of the temperature sensor 3 on the temperature detected by the temperature sensor 3 can be reduced. Note that the applied voltage V1 at this time may be any as long as the motor temperature is raised to a temperature suitable for calculation of the model parameters, and can be, for example, a voltage corresponding to the rated power of the motor.

The model parameters Ra, Rb, Rs, Ta, Tb, and Ts are calculated on the basis of the first rise transition L1 and the second rise transition L2 from time point T1 to time point T2. First, on the basis of the second rise transition L2, the thermal resistance Rs and the thermal time constant Ts related to the predetermined temperature characteristic models 12 and 31 and the thermal resistance Rb and the thermal time constant Tb related to the stator temperature characteristic models 22 and 32 are calculated. Specifically, the model parameters Rs, Ts, Rb, and Tb are calculated on the basis of the time required for the temperature detected by the temperature sensor 3 to rise from t0 to t2, input power, and the like using the least squares method. As a result, the predetermined temperature characteristic models 12 and 31 and the stator temperature characteristic models 22 and 32 are determined. Subsequently, the thermal resistance Ra and the thermal time constant Ta related to the winding temperature characteristic models 11 and 21 are calculated on the basis of the first rise transition L1. Note that in this calculation, already calculated values are used for the thermal resistance Rb and the thermal time constant Tb related to the stator temperature characteristic models 22 and 32. Similarly, specific calculation of the winding temperature characteristic models 11 and 21 is performed on the basis of the time required for the temperature detected by the temperature sensor 3 to rise from t0 to t1, input power, and the like using the least squares method. As a result, the winding temperature characteristic models 11 and 21 are determined.

The winding temperature characteristic model 11 and the predetermined temperature characteristic model 12 are created by using the model parameters calculated in this manner, and the calculation model 10 including both the winding temperature characteristic model 11 and the predetermined temperature characteristic model 12 is determined. By using the calculation model 10 determined in this manner, it is possible to estimate the winding temperature of the motor by electronic thermal using the detection value of the temperature sensor 3. In the estimation, since the winding temperature is calculated by the calculation model 10 in a form in which the detection delay included in the temperature sensor 3 is absorbed, it is possible to realize estimation of the winding temperature with high accuracy and little delay, and thus, it is possible to effectively suppress overheating of the winding of the motor 2.

First Example

Figure 4:
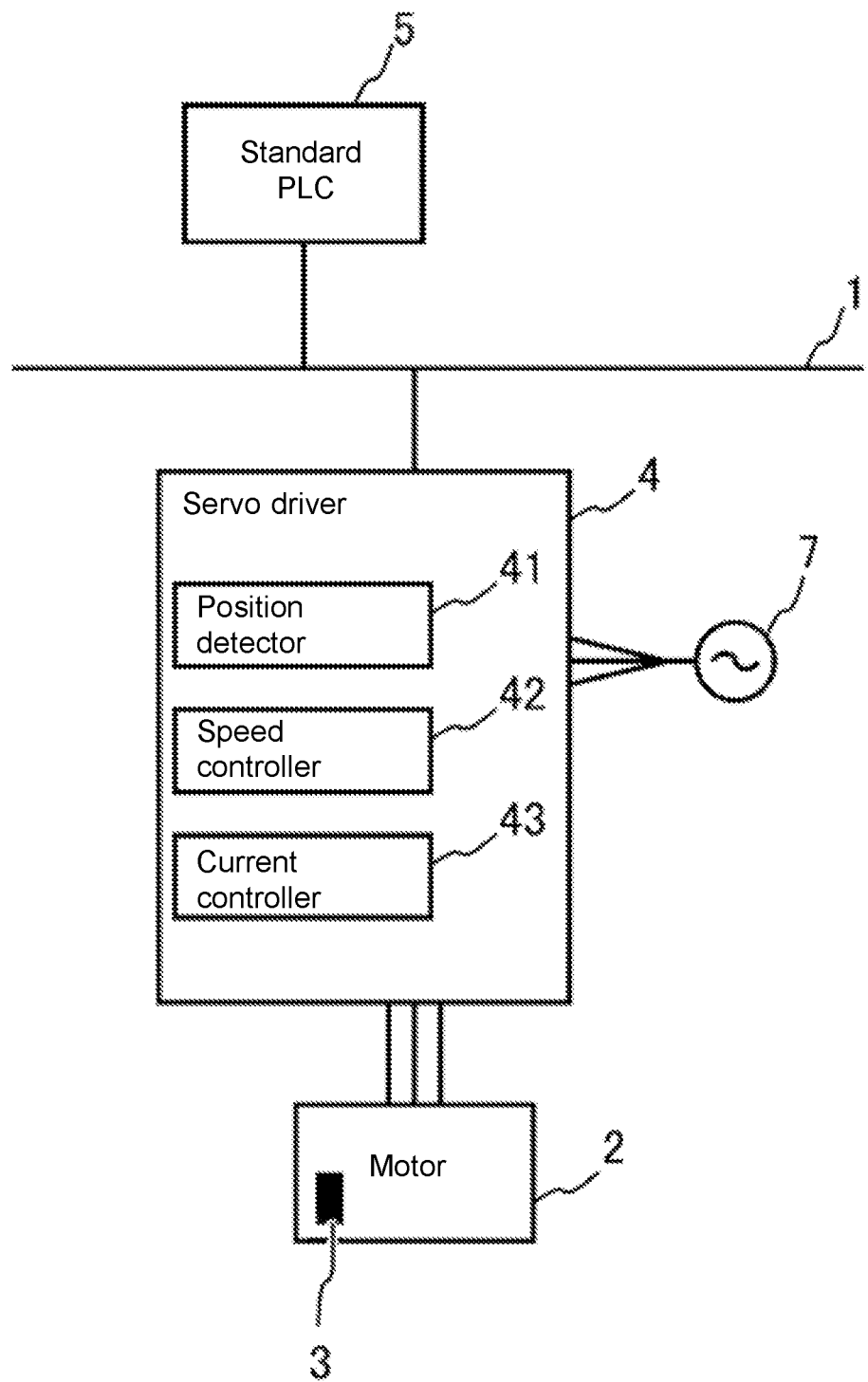
FIG. 4 is a schematic configuration of a control system configured by incorporating the motor.

FIG. 4 is a schematic configuration diagram of a control system including a servo driver 4 that also operates as the processing apparatus of the embodiment. The control system includes a network 1, the motor 2, the servo driver 4, and a standard programmable logic controller (PLC) 5. Note that the motor 2 includes the temperature sensor 3 as described above. The control system is a system for driving and controlling a load device, not illustrated, together with the motor 2. The motor 2 and the load device are controlled by the control system. Here, examples of the load device include various mechanical devices (for example, an arm of an industrial robot or a conveyance device). The motor 2 is incorporated in the load device as an actuator that drives the load device. For example, the motor 2 is an AC servomotor including a stator around which a winding is wound and a rotor. Note that an encoder, not illustrated, is attached to the motor 2, and a parameter signal related to operation of the motor 2 is fed back to the servo driver 4 by the encoder. The parameter signal (hereinafter referred to as a feedback signal) to be fed back includes, for example, position information on the rotational position (angle) of the rotation shaft of the motor 2, information on the rotational speed of the rotation shaft, and the like.

The servo driver 4 receives an operation command signal regarding operation (motion) of the motor 2 from the standard PLC 5 via the network 1, and receives the feedback signal output from the encoder connected to the motor 2. The servo driver 4 calculates a command value regarding servo control for driving the motor 2, that is, operation of the motor 2 on the basis of the operation command signal from the standard PLC 5 and the feedback signal from the encoder, and supplies a drive current to the motor 2 so that the operation of the motor 2 follows the command value. Note that AC power transmitted from an AC power supply 7 to the servo driver 4 is used for the supply current. In this example, the servo driver 4 is of a type that receives three-phase AC, but may be of a type that receives single-phase AC. Note that servo control performed by the servo driver 4 is feedback control using a position controller 41, a speed controller 42, and a current controller 43 included in the servo driver 4, and details thereof will be described later with reference to FIG. 5.

Here, as illustrated in FIG. 4, the servo driver 4 includes the position controller 41, the speed controller 42, and the current controller 43. The position controller 41, the speed controller 42, and the current controller 43 perform processes to execute the servo control described above. The servo driver 4 includes an electronic thermal unit 100 (see FIG. 5) to protect the motor 2 from damage due to overload. The electronic thermal unit 100 estimates the winding temperature of the motor 2 and determines the overload state of the motor 2 on the basis of the winding temperature that has been estimated. Therefore, the servo control performed by the servo driver 4 and the protection control of the motor 2 performed by the electronic thermal unit 100 will be described on the basis of the control structure formed in the servo driver 4 illustrated in FIG. 5. The control structure is formed by executing a predetermined control program in the servo driver 4 including a predetermined arithmetic device, a memory, and the like.

The position controller 41 performs, for example, proportional control (P control). Specifically, a speed command is calculated by multiplying the position deviation, which is the deviation between the position command notified from the standard PLC 5 and the detected position, by a position proportional gain Kpp. Note that the position controller 41 has the position proportional gain Kpp as a control parameter in advance. Next, the speed controller 42 performs, for example, proportional integral control (PI control). Specifically, a torque command is calculated by multiplying the integral amount of the speed deviation, which is the deviation between the speed command calculated by the position controller 41 and the detected speed, by a speed integral gain Kvi, and multiplying the sum of the calculation result and the speed deviation by a speed proportional gain Kvp. Note that the speed controller 42 has a speed integral gain Kvi and a speed proportional gain Kvp as control parameters in advance. Further, the speed controller 42 may perform P control in lieu of PI control. In this case, the speed controller 42 has the speed proportional gain Kvp as a control parameter in advance. Next, the current controller 43 generates a command voltage for driving an amplifier 44 on the basis of the torque command calculated by the speed controller 42. The amplifier 44 outputs a drive current for driving the motor 2 according to the command voltage that has been generated, thereby driving and controlling the motor 2. The current controller 43 includes a filter (first-order low-pass filter) regarding a torque command and one or a plurality of notch filters, and has, as control parameters, cutoff frequencies regarding performance of these filters and the like.

The control structure of the servo driver 4 includes a speed feedback system including the speed controller 42, the current controller 43, the motor 2 to be controlled, and the like as forward elements, and further includes a position feedback system including the speed feedback system and the position controller 41 as forward elements. With the control structure configured as described above, the servo driver 4 can servo-controls the motor 2 so that the motor 2 follows the position command supplied from the standard PLC 5.

If an excessive load (for example, a load exceeding the rated load of the motor 2) is applied to the motor 2 for a relatively long time when the motor 2 is servo-controlled in this manner, an excessive current flows through the winding of the motor 2 for a long time. Therefore, the winding temperature may excessively rise to cause burnout. In order to prevent the motor 2 from being driven in the overload state as described above, the servo driver 4 includes the electronic thermal unit 100. Specifically, the electronic thermal unit 100 includes the calculation model 10 illustrated in FIG. 1 and an overload judging unit 110. As described above, the calculation model 10 includes the winding temperature characteristic model 11 and the predetermined temperature characteristic model 12. When applied power in the motor 2 is given as an input to each model and the detection value of the temperature sensor 3 is given, the calculation model 10 outputs the winding temperature of the motor 2 as a result. Then, the overload judging unit 110 judges whether there is a possibility that the motor 2 will reach the overload state, in other words, whether there is a possibility that the temperature of the winding of the motor 2 will excessively rise, on the basis of the winding temperature, which is an output of the calculation model 10. Note that in a case where the overload judging unit 110 judges that the motor 2 is in an overload state, the servo driver 4 can stop driving the motor 2 to protect the motor 2.

Figure 5:
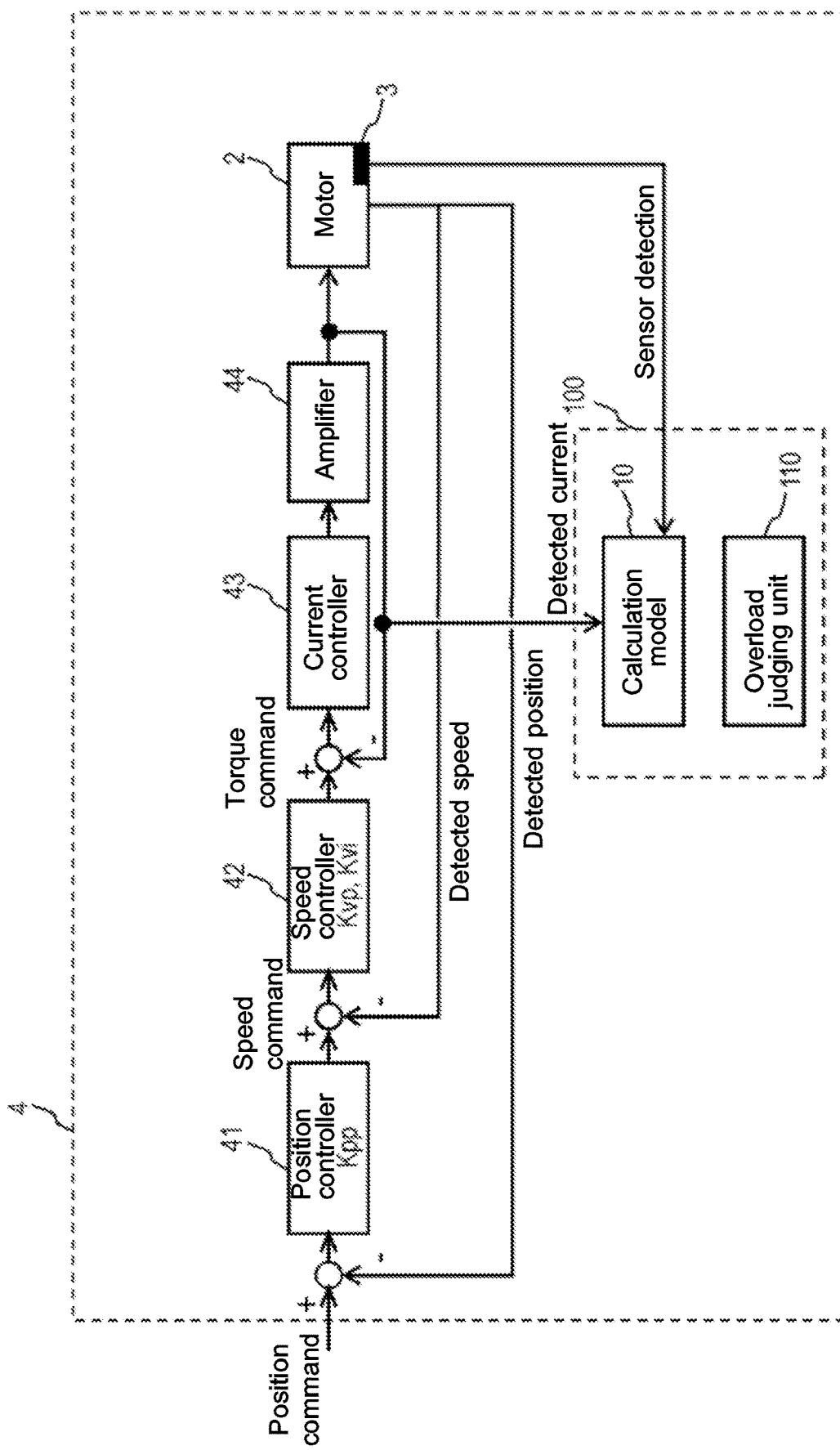
FIG. 5 is a first diagram illustrating a control structure formed by a servo driver of the control system illustrated in FIG. 4.
Figure 6:
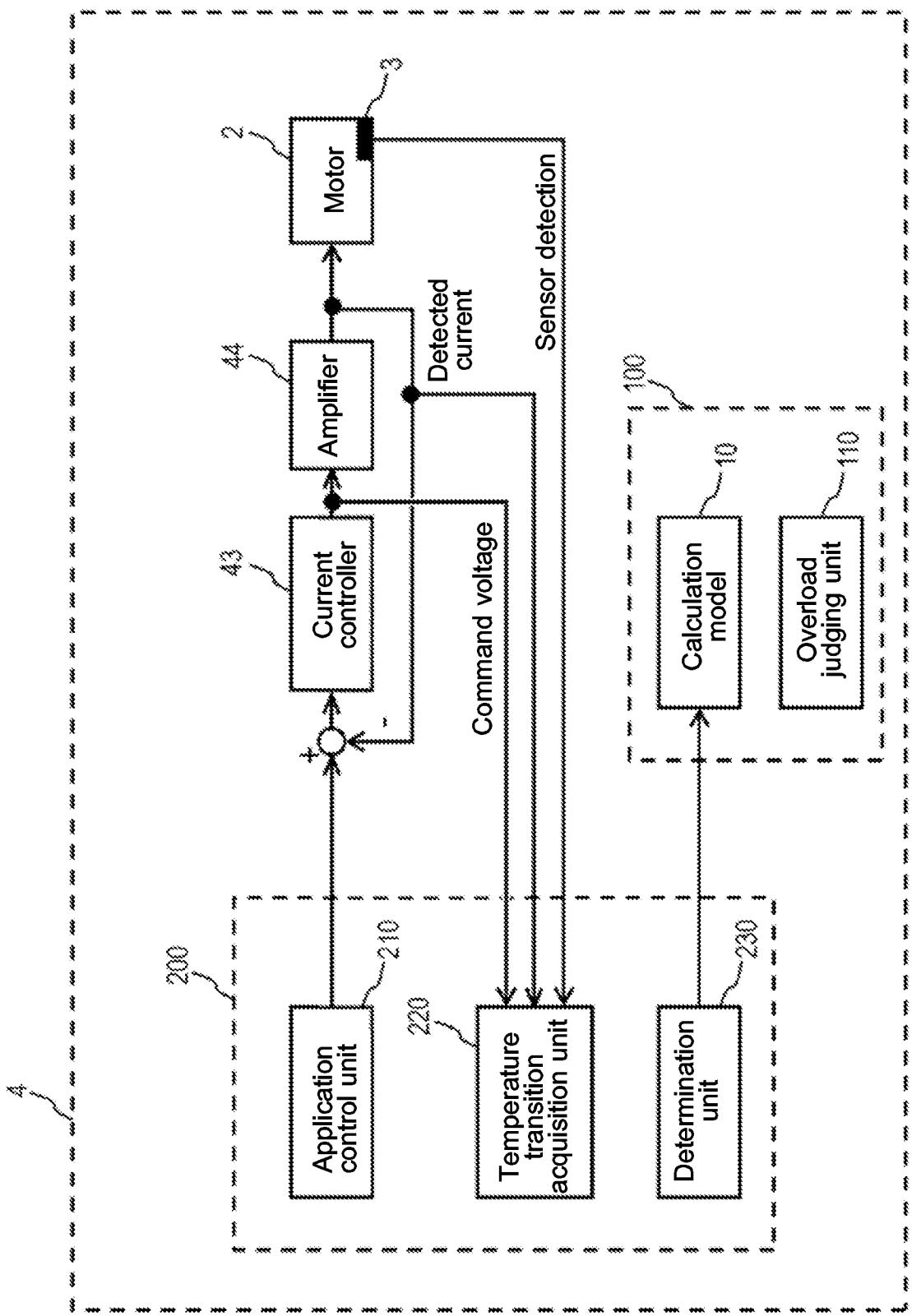
FIG. 6 is a second diagram illustrating the control structure formed by the servo driver of the control system illustrated in FIG. 4.

Here, the control structure for adapting the calculation model 10 included in the electronic thermal unit 100 to the motor 2 to be controlled by the servo driver 4 will be described with reference to FIG. 6. The servo driver 4 includes a model adaptation unit 200 for adapting the calculation model 10 to the motor 2. The model adaptation unit 200 calculates the model parameters of the calculation model 10 corresponding to the motor 2, that is, the thermal resistance Ra and the thermal time constant Ta of the winding temperature characteristic model 11 and the thermal resistance Rs and the thermal time constant Ts of the predetermined temperature characteristic model 12, the winding temperature characteristic model 11 and the predetermined temperature characteristic model 12 corresponding to the motor 2, and adapts the calculation model 10 to the motor 2 by using them. Note that when the calculation model 10 is adapted, the current controller 43 and the amplifier 44 illustrated in FIG. 5 are used; however, the position controller 41 and the speed controller 42 are not used. Therefore, the position controller 41 and the speed controller 42 are not illustrated in FIG. 6.

Here, the model adaptation unit 200 includes an application control unit 210, a temperature transition acquisition unit 220, and a determination unit 230. The application control unit 210 outputs, to the current controller 43, a command for voltage application for calculating the model parameters of the calculation model 10, that is, voltage application illustrated in the upper part of FIG. 3. Note that voltage application by the application control unit 210 is controlled to be suitable for calculation of the model parameters of the calculation model 10.

On the basis of the winding resistance value of the motor 2, the temperature transition acquisition unit 220 acquires the first rise transition L1 and the second rise transition L2 of the winding temperature when the calculation model 10 is adapted (when a voltage is applied). The winding temperature is acquired according to the following Formula 4.

Winding temperature $\theta 2 = R2/R1 \cdot (234.5 + \theta 1) - 234.5$ (4)

R1 is a winding resistance value at the start of voltage application (time point T1 in FIG. 3).

θ1 is a winding temperature at the start of voltage application. For example, the ambient temperature of the surrounding environment of the motor 2 (in a case where the ambient temperature can be acquired by the servo driver 4) or the detection value of the temperature sensor included in the encoder attached to the motor 2 can be used as θ1.

R2 is a winding resistance value at the time of voltage application. Note that acquisition of the winding resistance value R2 will be described later.

When the application control unit 210 applies a voltage, the temperature transition acquisition unit 220 acquires the winding temperature of the motor 2 at that time according to Formula 4.

The determination unit 230 calculates the thermal resistance Ra and the thermal time constant Ta of the winding temperature characteristic model 11 and the thermal resistance Rs and the thermal time constant Ts of the predetermined temperature characteristic model 12, the winding temperature characteristic model 11 and the predetermined temperature characteristic model 12 corresponding to the motor 2, on the basis of the first rise transition L1 and the second rise transition L2 acquired by the temperature transition acquisition unit 220. Calculation of these model parameters is as described above. Further, the determination unit 230 applies the model parameters that has been calculated to the winding temperature characteristic model 11 and the predetermined temperature characteristic model 12 of the calculation model 10 to determine the respective models. As a result, the calculation model 10 for the electronic thermal unit 100 illustrated in FIG. 1 is adapted to the motor 2 itself controlled by the servo driver 4.

Figure 7:
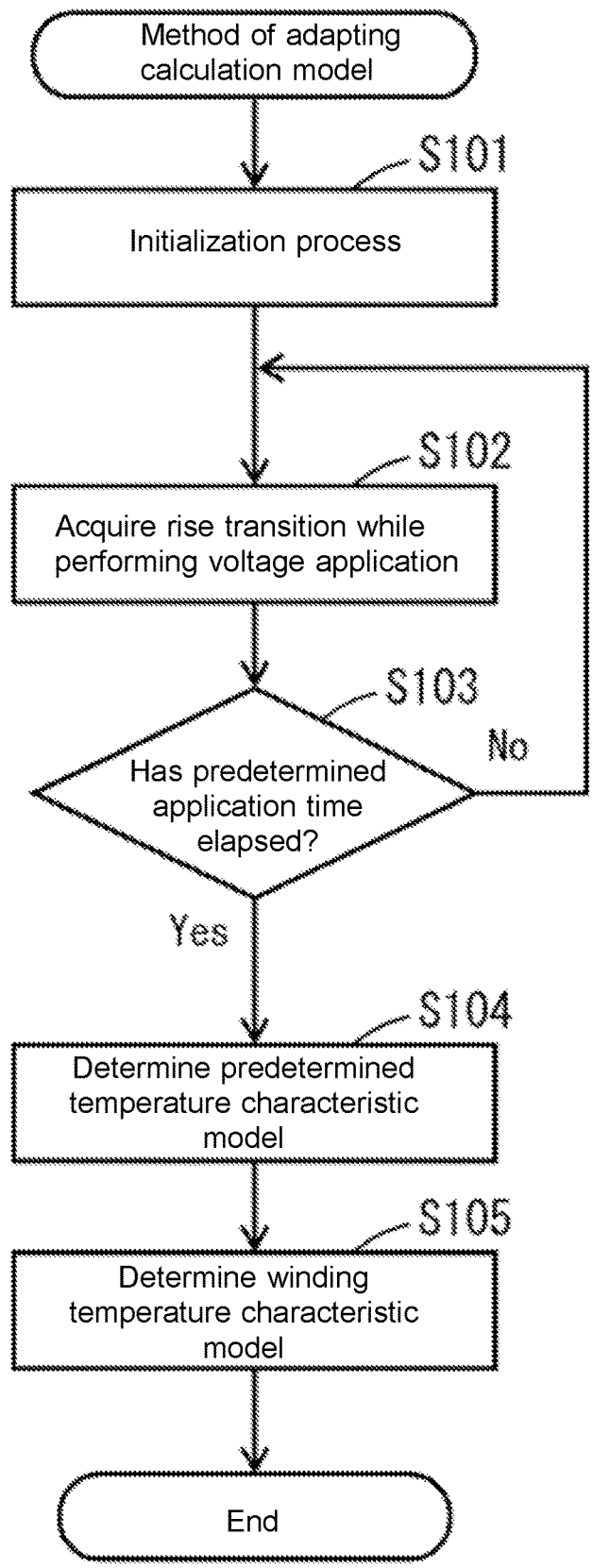
FIG. 7 is a flowchart illustrating a flow of processing of a method of adapting the calculation model to the motor, executed by the servo driver.

Here, a method of adapting the calculation model 10 by the model adaptation unit 200 will be described with reference to FIG. 7. FIG. 7 is a flowchart illustrating a flow of the method of adapting the calculation model 10 by the model adaptation unit 200. First, in S101, immediately before the application control unit 210 starts voltage application, an initialization process of acquiring the winding resistance value (R1 in Formula 4) of the motor 2 and the winding temperature (θ1 in Formula 4) thereof is performed. The winding resistance value is calculated on the basis of a current value obtained when a measurement voltage is applied between terminals of the motor. The winding temperature in this initialization process can be considered to be about the same as the outside air temperature because the motor 2 is placed in the surrounding environment for a sufficiently long time. Therefore, the outside air temperature or the temperature detected by the temperature sensor in the encoder installed in the motor 2 is acquired as the winding temperature in the initialization process.

Next, in S102, while voltage application is performed by the application control unit 210, the temperature transition acquisition unit 220 acquires the first rise transition L1 of the winding temperature of the motor 2 and the second rise transition L2 of the temperature detected by the temperature sensor 3. These rise transitions have a common voltage application period. Here, if voltage application for calculating the resistance value is separately performed when the winding temperature rises due to the voltage application, temperature rise control by the original voltage application is hindered. In the voltage application for model parameter calculation, it is necessary to raise the winding temperature of the motor 2 to t1. Therefore, if the temperature rise is disturbed every time the resistance value is calculated, it is difficult to suitably calculate the model parameters (thermal resistance and thermal time constant). Therefore, in the embodiment, in the voltage application for calculating the model parameters, voltage application is performed periodically to raise the winding temperature by the voltage application. Simultaneously, the winding resistance value of the motor 2 is calculated by using the frequency response of the current to the voltage application when the voltage application is used as an input to the motor 2 and the current flowing through the winding is used as an output.

Figure 8A:
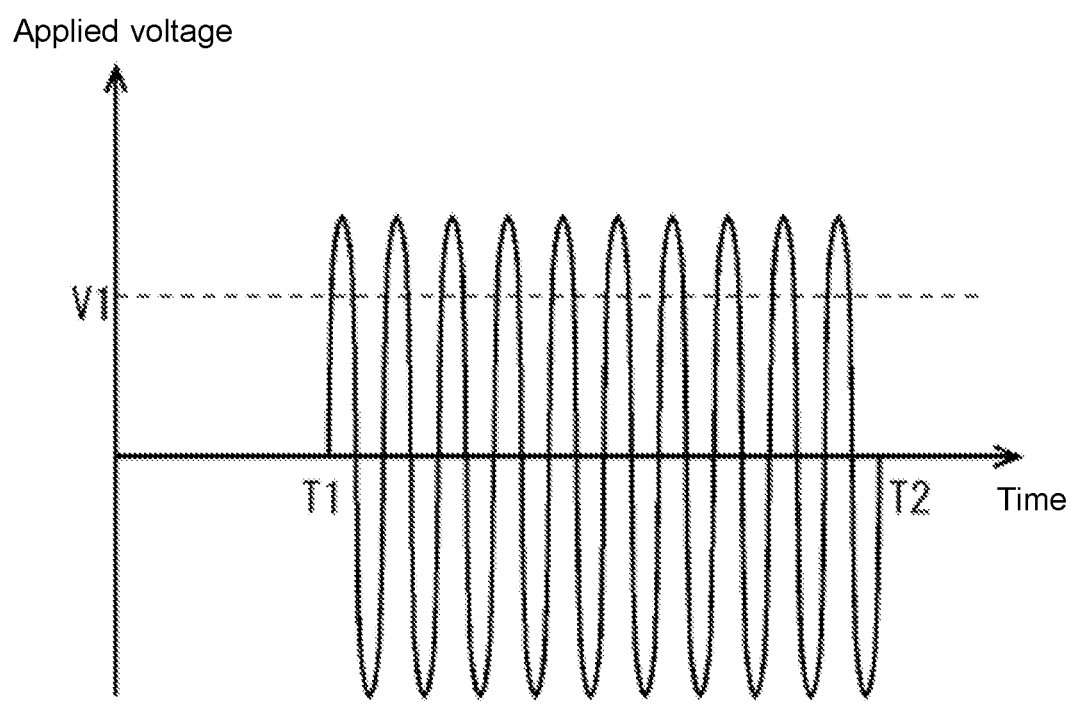
FIGS. 8A and 8B are diagrams illustrating transitions of a voltage applied to the motor.

Specifically, as illustrated in FIG. 8A, in the voltage application, a periodic sinusoidal voltage is applied in the application period (T1 to T2). At that time, the effective value (root mean square value) of the sinusoidal voltage is a voltage V1 illustrated in FIG. 3. By applying the periodic sinusoidal voltage in this manner, the winding temperature of the motor 2 can be raised to t1. Here, when the periodic voltage application is performed, the temperature transition acquisition unit 220 acquires the applied voltage value and the value of the current flowing through the winding of the motor 2 as an input value and an output value, respectively. The frequency response of the output value to the input value reflects the electrical characteristic of the motor 2 expressed by the following Formula 5.

Electrical characteristic of motor 2: $(1/R) \cdot (1/(Ts+1))$ (5)

where R is a winding resistance of the motor 2, and T is an electrical time constant of the motor 2.

Therefore, the temperature transition acquisition unit 220 calculates the frequency response of the output value, and further calculates the winding resistance R of the motor 2 according to the following Formula 6 using the gain G (ω) and the phase P (ω) obtained on the basis of the frequency response.

[Mathematical formula 1]

$$R = \frac{1}{G(\omega)\sqrt{1 + (\tan P(\omega))^2}}$$ (Formula 6)

Further, the temperature transition acquisition unit 220 substitutes the winding resistance R calculated by Formula 6 for R2 in Formula 4 to calculate the winding temperature (θ2 in Formula 4) at the time of acquiring the frequency response.

As described above, by using the frequency response of the current flowing through the winding of the motor 2 at the time of voltage application, the temperature transition acquisition unit 220 can acquire the first rise transition L1 and the second rise transition L2 by using the winding resistance value without hindering the temperature raising process (process of increasing the winding temperature to t1 and process of increasing the temperature detected by the sensor 3 to t2) of the motor 2. Note that the acquisition timing of each rise transition by the temperature transition acquisition unit 220, that is, the acquisition timing of the frequency response may be appropriately set within a range in which each rise transition can be acquired to such an extent that the model parameters can be calculated.

Figure 8B:
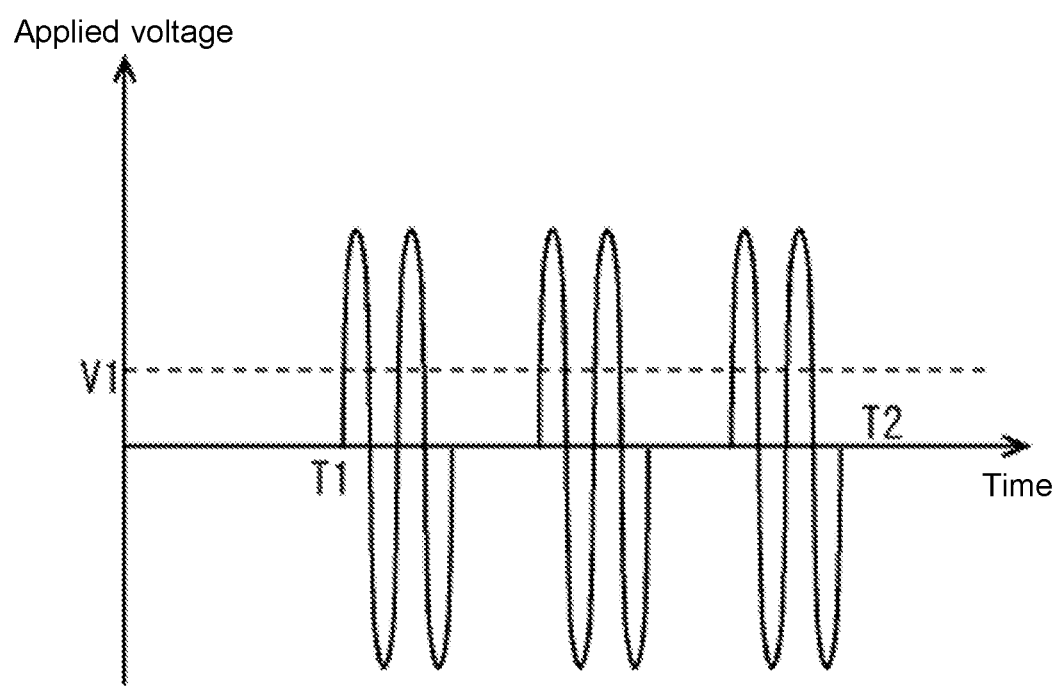

Note that in the example illustrated in FIG. 8A, a sinusoidal voltage is continuously applied during the application period. Alternatively, as illustrated in FIG. 8B, a sinusoidal voltage may be intermittently applied as long as the winding temperature of the motor 2 can converge to the equilibrium state of t1.

At this time, the root mean square value of the intermittent sinusoidal voltage in the application period is the voltage V1. In addition, the cycle of the applied voltage at the time of voltage application may be appropriately determined as long as an appropriate frequency response for calculating the winding resistance value is acquired. If the cycle of the applied voltage becomes too long, the winding temperature tends to change rapidly due to voltage application. In contrast, if the cycle of the applied voltage becomes too short, it becomes difficult to suitably reflect the electrical characteristics of the motor 2 in the frequency response. Therefore, the frequency of the sinusoidal voltage to be applied is set to, for example, ⅓ to 3 times, preferably ½ to 2 times, and more preferably equal to the frequency corresponding to the reciprocal of the electrical time constant of the motor 2. This makes it possible to adjust and acquire temperature of the motor 2 in a well-balanced manner.

Next, in S103, it is judged whether or not a predetermined voltage application time suitable for calculation of the model parameters has elapsed.

As an example, the predetermined voltage application time may be an application time until the winding temperature of the motor 2 converges to t1. When the rise change rate of the winding temperature of the motor 2 becomes equal to or less than a predetermined threshold, it can be judged that the rise has converged. Note that the rise change rate is defined as the amount of rise in winding temperature per unit time. In addition, the threshold may be a predetermined fixed value. Alternatively, the threshold may be determined on the basis of the rise change rate of the winding temperature immediately after the start of voltage application, that is, the rise change rate considered to be the highest in the application period. For example, ¹⁄₁₀ of the rise change rate assumed to be the highest may be used as the threshold. When an affirmative judgement is made in S103, the process proceeds to S104, and when a negative judgement is made, the process in S102 and the subsequent process are repeated to continue voltage application.

Next, in S104, as described with reference to FIGS. 1 to 3, the thermal resistance Rb and the thermal time constant Tb, which are model parameters of the stator temperature characteristic models 22 and 32, and the thermal resistance Rs and the thermal time constant Ts, which are model parameters of the predetermined temperature characteristic models 12 and 31, are calculated on the basis of the second rise transition L2 acquired in S102, and the respective models are determined. Furthermore, in S105, the thermal resistance Ra and the thermal time constant Ta, which are model parameters of the winding temperature characteristic models 11 and 21, are calculated on the basis of the first rise transition L1 acquired in S102, and the winding temperature characteristic models 11 and 21 are determined.

As described above, according to the method of adapting the calculation model illustrated in FIG. 7, the suitable calculation model 10 adapted to the motor 2 driven by the servo driver 4 can be prepared. As a result, when the motor 2 is driven, the winding temperature can be accurately estimated by the electronic thermal unit 100 while suitably suppressing detection delay of the temperature sensor 3, and the motor 2 can be suitably protected from overload.

Other Example

In the example described above, the model adaptation unit 200 is formed in the servo driver 4. Alternatively, the model adaptation unit 200 may be formed in a processing apparatus (for example, a personal computer (PC) or the like) electrically connectable to the servo driver 4. The processing apparatus is an apparatus for adapting the calculation model to the motor 2, and includes adaptation software (program). Specifically, the processing apparatus is a computer including an arithmetic device, a memory, and the like, and the method of adapting the calculation model illustrated in FIG. 7 is realized by installing a program that can be executed therein and executing the program.

The dimensions, materials, shapes, and the relative arrangement of the configurations described in the embodiment described above, the order of respective processes included in the method in the embodiment described above, and the like are not intended to limit the technical scope of the invention only to them unless otherwise specified.

Addendum A processing apparatus (4) that determines a calculation model (10) for estimating a temperature of a winding, the calculation model (10) being included in electronic thermal (100) of a motor (2) including a stator around which the winding is wound and a rotor, the calculation model (10) including a winding temperature characteristic model (11) including a winding related parameter related to a temperature characteristic of the winding, and a predetermined temperature characteristic model (12) including a predetermined parameter related to a characteristic of a temperature in the vicinity of the winding detected by a temperature sensor (3) disposed in the vicinity of the winding, the processing apparatus (4) including:

a temperature transition acquisition unit (220) configured to acquire a first rise transition (L1) that is a rise transition of a temperature of the winding and a second rise transition (L2) that is a rise transition of a temperature detected by the temperature sensor in a state where voltage application for raising the temperature of the winding to a predetermined temperature is performed; and a determination unit (230) configured to determine the predetermined temperature characteristic model (12) by calculating the predetermined parameter on the basis of the second rise transition (L2), and further configured to determine the winding temperature characteristic model (11) by calculating the winding related parameter on the basis of the first rise transition (L1).

A determination method of a winding temperature calculation model being a method of determining a calculation model (10) for estimating a temperature of a winding, the calculation model (10) being included in electronic thermal (100) of a motor (2) including a stator around which the winding is wound and a rotor, the calculation model (10) including a winding temperature characteristic model (11) including a winding related parameter related to a temperature characteristic of the winding, and a predetermined temperature characteristic model (12) including a predetermined parameter related to a characteristic of a temperature in the vicinity of the winding detected by a temperature sensor (3) disposed in the vicinity of the winding, the determination method including:

a step (S102) of acquiring a first rise transition (L1) that is a rise transition of a temperature of the winding and a second rise transition (L2) that is a rise transition of a temperature detected by the temperature sensor in a state where voltage application for raising the temperature of the winding to a predetermined temperature is performed; and a step (S104, S105) of determining the predetermined temperature characteristic model (12) by calculating the predetermined parameter on the basis of the second rise transition (L2), and further determining the winding temperature characteristic model (11) by calculating the winding related parameter on the basis of the first rise transition (L1).

DESCRIPTION OF SYMBOLS 2 motor
3 temperature sensor
4 servo driver
10 calculation model
11 winding temperature characteristic model
12 predetermined temperature characteristic model
100 electronic thermal unit
200 model adaptation unit
210 application control unit
220 temperature transition acquisition unit
230 determination unit

The invention claimed is:

1. A processing apparatus that determines a calculation model for estimating a temperature of a winding, the calculation model being included in an electronic thermal unit of a motor including a stator around which the winding is wound and a rotor, the calculation model including a winding temperature characteristic model including a winding related parameter related to a temperature characteristic of the winding, and a predetermined temperature characteristic model including a predetermined parameter related to a characteristic of a temperature in a vicinity of the winding detected by a temperature sensor disposed in the vicinity of the winding, the processing apparatus comprising:

a temperature transition acquisition unit configured to acquire a first rise transition that is a rise transition of a temperature of the winding and a second rise transition that is a rise transition of a temperature detected by the temperature sensor in a state where voltage application for raising the temperature of the winding to a predetermined temperature is performed; and a determination unit configured to determine the predetermined temperature characteristic model by calculating the predetermined parameter on a basis of the second rise transition, and further configured to determine the winding temperature characteristic model by calculating the winding related parameter on a basis of the first rise transition, wherein the determination unit determines the predetermined temperature characteristic model by calculating the predetermined parameter on the basis of the second rise transition via a stator temperature characteristic model including a stator related parameter related to a temperature characteristic of the stator and having a correlation with the winding temperature characteristic model and the predetermined temperature characteristic model, and determines the winding temperature characteristic model by calculating the winding related parameter on the basis of the first rise transition via the stator temperature characteristic model.

2. The processing apparatus according to claim 1, wherein the temperature transition acquisition unit acquires the first rise transition on a basis of a resistance value of the winding.

3. The processing apparatus according to claim 2, further comprising:

a frequency response acquisition unit configured to acquire a frequency response in the motor obtained when a voltage applied to the winding is an input and a current flowing through the winding is an output; and a resistance calculation unit configured to calculate a resistance value of the winding on a basis of the frequency response.

4. The processing apparatus according to claim 3, wherein voltage application in a first cycle is performed in the voltage application, the resistance calculation unit calculates a resistance value of the winding at a time of the voltage application on a basis of the frequency response acquired by the frequency response acquisition unit according to a current output from the motor when the voltage application in the first cycle is input, and the temperature transition acquisition unit acquires the first rise transition on a basis of the resistance value of the winding calculated by the resistance calculation unit.

5. The processing apparatus according to claim 1, wherein the rotor of the motor is rotationally driven at a predetermined constant speed when the voltage application is performed.

6. A determination method of a winding temperature calculation model for estimating a temperature of a winding, the winding temperature calculation model being included in an electronic thermal unit of a motor including a stator around which the winding is wound and a rotor, the winding temperature calculation model including a winding temperature characteristic model including a winding related parameter related to a temperature characteristic of the winding, and a predetermined temperature characteristic model including a predetermined parameter related to a characteristic of a temperature in a vicinity of the winding detected by a temperature sensor disposed in the vicinity of the winding, the determination method comprising:
　a step of acquiring a first rise transition that is a rise transition of a temperature of the winding and a second rise transition that is a rise transition of a temperature detected by the temperature sensor in a state where voltage application for raising the temperature of the winding to a predetermined temperature is performed; and
　a step of determining the predetermined temperature characteristic model by calculating the predetermined parameter on a basis of the second rise transition, and further determining the winding temperature characteristic model by calculating the winding related parameter on a basis of the first rise transition,
　wherein in the step of determining, the predetermined temperature characteristic model is determined by calculating the predetermined parameter on a basis of the second rise transition via a stator temperature characteristic model including a stator related parameter related to a temperature characteristic of the stator and having a correlation with the winding temperature characteristic model and the predetermined temperature characteristic model, and the winding temperature characteristic model is determined by calculating the winding related parameter on a basis of the first rise transition via the stator temperature characteristic model.

7. A processing apparatus that determines a calculation model for estimating a temperature of a winding, the calculation model being included in an electronic thermal unit of a motor including a stator around which the winding is wound and a rotor, the calculation model including a winding temperature characteristic model including a winding related parameter related to a temperature characteristic of the winding, and a predetermined temperature characteristic model including a predetermined parameter related to a characteristic of a temperature in a vicinity of the winding detected by a temperature sensor disposed in the vicinity of the winding, the processing apparatus comprising:
　a temperature transition acquisition unit configured to acquire a first rise transition that is a rise transition of a temperature of the winding and a second rise transition that is a rise transition of a temperature detected by the temperature sensor in a state where voltage application for raising the temperature of the winding to a predetermined temperature is performed;
　a determination unit configured to determine the predetermined temperature characteristic model by calculating the predetermined parameter on a basis of the second rise transition, and further configured to determine the winding temperature characteristic model by calculating the winding related parameter on a basis of the first rise transition;
　a frequency response acquisition unit configured to acquire a frequency response in the motor obtained when a voltage applied to the winding is an input and a current flowing through the winding is an output; and
　a resistance calculation unit configured to calculate a resistance value of the winding on a basis of the frequency response, wherein
　voltage application in a first cycle is performed in the voltage application,
　the resistance calculation unit calculates a resistance value of the winding at a time of the voltage application on a basis of the frequency response acquired by the frequency response acquisition unit according to a current output from the motor when the voltage application in the first cycle is input, and
　the temperature transition acquisition unit acquires the first rise transition on a basis of the resistance value of the winding calculated by the resistance calculation unit.

* * * * *